(12) United States Patent
Dudek

(10) Patent No.: US 7,601,568 B2
(45) Date of Patent: Oct. 13, 2009

(54) MOS TRANSISTOR AND METHOD FOR PRODUCING A MOS TRANSISTOR STRUCTURE

(75) Inventor: Volker Dudek, Brackenheim (DE)

(73) Assignee: Atmel Germany GmbH, Heilbronn (DE)

( * ) Notice: Subject to any disclaimer, the term of this patent is extended or adjusted under 35 U.S.C. 154(b) by 169 days.

(21) Appl. No.: 11/727,871

(22) Filed: Mar. 28, 2007

(65) Prior Publication Data

US 2007/0184599 A1 Aug. 9, 2007

Related U.S. Application Data

(62) Division of application No. 11/045,387, filed on Jan. 31, 2005, now Pat. No. 7,233,044.

(30) Foreign Application Priority Data

Feb. 2, 2004 (DE) .................. 10 2004 005 948

(51) Int. Cl.
*H01L 21/00* (2006.01)
(52) U.S. Cl. ............... 438/149; 438/311; 438/197; 438/479; 438/517; 438/510; 257/E27.112
(58) Field of Classification Search ............... 438/149, 438/311, 197, 479, 517, 510; 257/E27.112
See application file for complete search history.

(56) References Cited

U.S. PATENT DOCUMENTS

| | | | |
|---|---|---|---|
| 5,338,965 A | 8/1994 | Malhi | |
| 5,481,126 A * | 1/1996 | Subramanian et al. | 257/273 |
| 5,686,755 A | 11/1997 | Malhi | |
| 5,780,900 A * | 7/1998 | Suzuki et al. | 257/335 |
| 6,204,098 B1 | 3/2001 | Anceau | |
| 6,281,593 B1 | 8/2001 | Brown et al. | |
| 6,346,451 B1 | 2/2002 | Simpson et al. | |
| 6,756,257 B2 * | 6/2004 | Davari et al. | 438/151 |
| 6,794,719 B2 | 9/2004 | Petruzello et al. | |
| 6,933,196 B2 * | 8/2005 | Back | 438/259 |
| 2003/0104681 A1 * | 6/2003 | Davari et al. | 438/480 |

FOREIGN PATENT DOCUMENTS

| | | | |
|---|---|---|---|
| EP | 0786818 A2 | 7/1997 | |
| EP | 1049156 A1 | 11/2000 | |

* cited by examiner

*Primary Examiner*—Davienne Monbleau
*Assistant Examiner*—Hajar Kolahdouzan
(74) *Attorney, Agent, or Firm*—Muncy, Geissler, Olds & Lowe, PLLC

(57) ABSTRACT

A MOS transistor, and a method for producing the same, is provided with a source region, a gate-region, a drain region, and a drift region in an SOI wafer. The SOI-wafer has a carrier layer, which carries an insulating intermediate layer, and whereby the insulating intermediate layer carries an active semiconductor layer, in which laterally different doping material concentrations define the source region, the drift region, and the drain region. Whereby, the active semiconductor layer, at least in a portion of the drift region, is thicker than in the source region. The MOS transistor is characterized in that the active semiconductor layer, in a vertical direction, is completely separated by the insulating intermediate layer from the carrier layer.

14 Claims, 2 Drawing Sheets

MOS TRANSISTOR AND METHOD FOR PRODUCING A MOS TRANSISTOR STRUCTURE

This is a divisional application under 37 C.F.R. § 1.53(b) of prior application Ser. No. 11/045,387 filed on Jan. 31, 2005, now U.S. Pat. No. 7,233,044, the entire contents of which are hereby incorporated by reference.

BACKGROUND OF THE INVENTION

1. Field of the Invention

The present invention relates to a MOS transistor (MOS=metal oxide semiconductor) having a source region, a gate region, a drain region, and a drift region in an SOI wafer (SOI=semiconductor on insulator), whereby the SOI wafer has a carrier layer, which carries an insulating intermediate layer, and whereby the insulating intermediate layer carries an active semiconductor layer, in which laterally different doping material concentrations define the source region, the drift region, and the drain region, and whereby the active semiconductor layer, at least in one part of the drift region, is thicker than in the source region.

The invention relates further to a method for producing a MOS transistor structure having a source region, a gate region, a drain region, and a drift region in an SOI wafer, whereby the SOI wafer has a support layer, which bears an insulating intermediate layer, and whereby the insulating intermediate layer bears an active semiconductor layer, in which laterally different doping material concentrations define the source region, the drift region, and the drain region, and whereby the active semiconductor layer, at least in one part of the drift region, is thicker than in the source region.

2. Description of the Background Art

A MOS transistor and method are known from U.S. Pat. No. 5,338,965. In this publication, a DMOS transistor is provided, whose source and channel regions lie on a field oxide. A resurf drift region is electrically insulated by a pn-junction from the substrate material. High leakage currents result because the drift region is not dielectrically insulated.

A DMOS transistor (DMOS=double diffused MOS) is a MOS transistor, whose channel is produced not solely by photolithographic processes, but by diffusion processes. According to current understanding, a DMOS transistor compared with a conventional CMOS transistor (complementary metal oxide semiconductor) is characterized in that a drift region is provided between an edge of a control gate and a drain region of the transistor, i.e., a region in which the movement of the charge carrier is effected only through an electrical field prevailing between the opposite ends of the region. In a lateral DMOS transistor (LDMOS transistor), the drift region extends in the lateral direction, between the edge of the control gate and the drain region removed therefrom in the lateral direction.

A sideways, lateral growth in a trench, whose bottom is covered by oxide, is known from U.S. Pat. No. 5,481,126. This prior-art method is not advantageous because a connection to the bulk wafer remains in the finished structure.

A structure is known from EP 1 049 156 A1 in which a trench structure (trench) is surrounded by oxide. The trench is filled by an ELO process (ELO=epitaxial lateral overgrowth) with use of a seed, which was produced in the bottom of the trench by opening the oxide layer. A seed is understood to be a surface structure of a single crystal to which atoms attach during the ELO process and thereby assume the crystal orientation of the single crystal. The seed opening is then closed by a trench. This is a costly and space-consuming structure. Only SOI islands insulated from one another can be fabricated.

According to U.S. Pat. No. 6,204,098 B1, insulated islands are produced by epitaxial growth. The active silicon layer of the SOI wafer serves as the seed. Here as well, only insulated islands of the same height can be produced.

In U.S. Pat. No. 5,686,755, a DMOS transistor is presented, whose source and channel regions are within a buried oxide. The resurf driftzone (Resurf=reduced surface field) is electrically insulated from the substrate material by means of a pn junction. Because the drift zone is not dielectrically insulated, high leakage currents develop.

BCDMOS technology (BCDMOS=bipolar-CMOS-DMOS) is generally understood to be integrated circuits and their manufacturing processes, in which high-voltage DMOS features are combined with low-voltage CMOS and bipolar properties on a chip. A voltage of five volts is a typical example of low voltage, whereas high voltage in this context is understood to be values of up to more than one hundred volts. DMOS transistors are used as high-voltage components, whereby the high voltage can be applied between the drain region and the source region of the transistor.

In contrast to the bipolar technology, in MOS technologies there is a systematic approach to structure miniaturization by scaling of the length scale for component dimensions. Important electrical properties of MOS transistors do not depend on individual lengths, but rather on the ratios of transistor width and channel length. Based on this dependence, in principle all lengths and widths within a circuit can be reduced by a mutual scaling factor k, without a change in electrical properties.

The scale miniaturization of components in BCDMOS circuits with vertical SOI insulation, however, is limited by the aforementioned contradictory requirements. To minimize leakage currents at high temperatures, the active silicon thickness in the CMOS portion should be very thin, so that source and drain lie upon the buried oxide. In the DMOS drift region, the active silicon layer in contrast should be thicker to increase the dielectric strength.

SUMMARY OF THE INVENTION

It is therefore an object of the present invention to provide a MOS transistor and a method for producing a MOS transistor structure with active semiconductor layers having a different thickness with a planar surface, in which an increase of leakage currents, as is to be expected in a scaled reduction of the structure width, does not occur or occurs at least only to a limited extent.

This object is attained with a MOS transistor of the aforementioned type in that the active layer is completely separated in the vertical direction by the insulating intermediate layer of the carrier layer.

Further, this object is attained with a method of the aforementioned type in that in an SOI wafer serving as the starting material a trench is produced in an active layer having a first thickness. The trench cuts through an initially planar insulating intermediate layer. An insulating intermediate layer is applied to the edges and the bottom of the trench. The insulating intermediate layer is then removed at least in one region of the trench edges, which cuts through the active layer, and the trench is filled with an active semiconductor layer, which is thicker than the active semiconductor layer in the source region.

Through these features, particularly by the active semiconductor layers having a different thickness (e.g., silicon regions) in the SOI wafer, CMOS transistors and DMOS transistors within an SOI wafer can be optimized independently of one another without the planarity of the surface being lost. The greater thickness in the drift region of the DMOS transistor improves the dielectric strength and the thickness, smaller in comparison, in the portion of the source region corresponding to the thickness in the rest of the wafer outside the drift regions. Leakage currents of the CMOS transistors in the BCDMOS structure can be reduced by the smaller thickness outside the drift regions. As a result, low power CMOS structures can be also produced in addition to the DMOS structures.

In view of the embodiment of the MOS transistor, it is preferable that the active semiconductor layer in the portion of the drift region, in which the active semiconductor layer thickness is thicker than in the source region, extends more deeply into the carrier layer than in the source region.

In this embodiment, the higher thickness is produced within the wafer to a certain extent, so that the wafer can also retain a planar surface with active regions having a different thickness.

It is also preferred that the active semiconductor layer has a planar structure on one surface.

A planar structure can be processed further more easily than a structure which has steps of different height. Thus, for example, metal contacting can be applied more simply and more reliably onto planar structures.

It is further preferred that a transition from a first thickness of the active layer in the source region to a second thickness in the portion of the drift region, in which the active semiconductor layer is thicker than in the source region, is stepwise in nature.

This type of stepwise transition can be produced simply by masking steps and etching steps.

It is also preferred that a transition of a first thickness of the active layer in the source region to a second thickness in the section of the drift region, in which the active semiconductor layer is thicker than in the source region, occurs continuously.

Field strength elevations at the edges of the drift zone can be reduced by this type of continuous transition.

Another preferred embodiment is characterized in that the continuous transition occurs parallel to a crystal plane of the active semiconductor layer.

In this case, an epitaxial step of a preferred growth in the lateral direction occurs so that the structure can be filled easily without voids.

It is also preferred that the active semiconductor material in the portion of the drift region, in which the active semiconductor layer is thicker than in the source region, has a lateral doping material concentration gradient.

This embodiment permits optimization of the electrical properties of the drift zone, for example, optimization of the resurf effect.

Another preferred embodiment is characterized by, at least in areas, a single-crystal silicon as being the starting material of the active semiconductor layer.

Silicon possesses a cubic crystal system with a plane and is therefore especially suitable for lateral epitaxy for the production of the greater thickness of the active range of the drift zone.

In a preferred embodiment, the filling of the trench occurs by selective epitaxial lateral overgrowth (ELO).

Selective, means that during epitaxial growth the process parameters are adjusted such that growth proceeds only from the exposed, single-crystal semiconductor material. No depositing occurs at places where there are surfaces, for example, oxide or nitride surfaces. This circumstance facilitates the subsequent planarization through better uniformity and shorter process times.

It is also preferred that regions of the trench edges, which cut through the active layer, serve as seed openings for the selective epitaxial overgrowth.

Thus, the present single-crystal orientation of the thin active layer in the SOI wafer serving as the starting material can be assumed by the epitaxial process for the thick layer. Discontinuities in the lattice structure at the junction between the active regions having a different thickness, which could have a negative effect on the electrical properties, are avoided thereby.

It is preferred furthermore that the entire trench is filled by epitaxial growth and that the epitaxy mushrooms formed by growth are removed by chemical/mechanical polishing to the extent that a largely planar surface of the MOS transistor structure forms.

A homogeneous single-crystal active layer having a greater thickness forms due to the complete filling of the trench. Excess growth in the vertical direction is not harmful, because the already named advantages of a planar surface are produced by the chemical/mechanical polishing. This enables a planar structure despite the different regions having different thickness of the active semiconductor regions.

It is also preferred that the doping is changed during the selective epitaxy.

Through this embodiment, in the drift region a freely adjustable doping material concentration profile is produced with the result that the breakdown voltage (dielectric strength) can be increased and the on-resistance reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
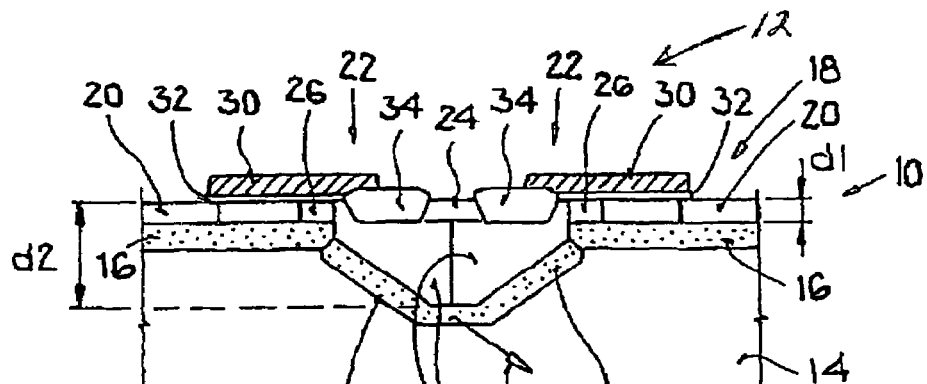
FIG. 1 shows a cross-section through a DMOS structure within an integrated circuit produced by the BCDMOS technology, according to a preferred embodiment of the present invention.

FIG. 1 is an illustration of an SOI wafer 10 with a MOS transistor 12. The SOI wafer 10 has a carrier layer 14, which carries an insulating intermediate layer 16. An active semiconductor layer 18 is arranged on the insulating intermediate layer 16. The MOS transistor 12 has source regions 20, a gate region 22, a drain region 24, and a drift region 26, 28. The source regions 20, the drift region 26, 28, and the drain region 24 have laterally different doping material concentrations in each case in the active semiconductor layer 18. The active semiconductor layer 18 is at least in one portion 28 of the drift region 26, 28 thicker than in the source region 20 and is insulated completely dielectrically against the carrier layer 14 in the vertical direction by the underlying, insulating intermediate layer 16. Subregions of source 20, channel region under the gate region 22, and drift region 26, 28 extend to the underlying insulating intermediate layer (e.g., oxide layer) 16.

In a realization of the MOS transistor 12 as an NMOS transistor, the source regions 20 and the drain region 24 have highly doped, n-conducting zones in the low-doped p-conducting starting material of the active semiconductor layer 18. In a complementary PMOS transistor, the doping is swapped (substrate n-conducting, source, p-type drain). The intermediate region between the source regions 20 and the drain region 24 form a channel region, which is partially covered by a gate electrode 30. The gate electrode 30 is insulated from the active semiconductor layer 18 by a dielectric 32, for example, silicon dioxide.

Earlier MOS transistors had in the gate region 22 an eponymous layer sequence of metal electrode (M), oxide insulation (O), and semiconductor layer (S). In modern MOS transistors, the gate electrode 30 usually includes polycrystalline silicon, which, based on high doping, has a good conductivity. Gate electrode 30 and carrier layer 14 in the channel region form a capacitor, whose charge determines the electrical field in the channel region. The field strength controls the pn junctions between source 20 and the channel region and between the drain region 24 and the channel region, as a result of which the conductivity of the channel region is controlled.

A DMOS transistor produced in the SOI wafer 10 as a MOS transistor 12 is characterized in that the active semiconductor layer 18 in the section 28 of the drift region 26, 28, in which the active semiconductor layer 18 is thicker than in the source region 20, extends more deeply into the carrier layer 14 than in the source region 20. As a result, the active semiconductor layer 18 on its surface, therefore on the side not facing the carrier layer 14, has a planar structure.

The transition from a first thickness d1 of the active semiconductor layer 18 in the source region 20 to a second thickness d2 in the portion 28 of the drift region 26, 28, in which the active semiconductor layer 18 is thicker than in the source region 20, can occur in steps. In FIG. 1, however, an embodiment is shown in which a transition from the first thickness d1 to the second thickness d2 occurs continuously. Preferably, the transition occurs parallel to a crystal plane 111 of the active semiconductor layer 18, which consists, for example, of silicon as the starting material.

To improve its electrical properties, the active semiconductor material in the section 28 of the drift region 26, 28, in which the active semiconductor layer 18 is thicker than in the source region 20, can have a lateral doping material concentration gradient.

Source regions 20 and drain region 24 are insulated dielectrically from one another on the surface of the SOI wafer 10 by trench structures 34, which are filled with a dielectric, for example, flat STI trenches filled with silicon dioxide (STI=shallow trench insulation).

Figure 2:
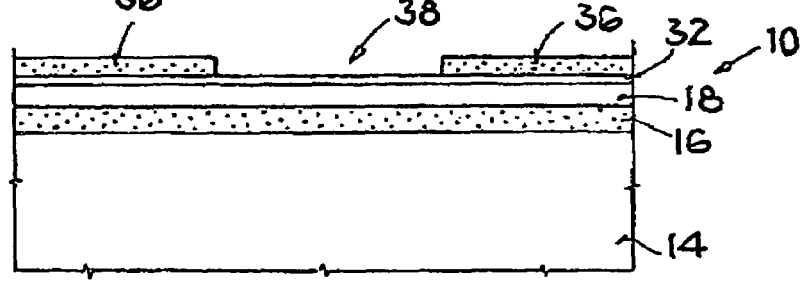
FIG. 2 shows a cross-section through an SOI wafer serving as the starting material for the production of an integrated circuit, according to a preferred embodiment.

An exemplary embodiment of the method of the invention is described below with reference to FIGS. 2 to 7. In this case, FIG. 2 shows an SOI wafer 10 as the starting material. The SOI wafer includes, for the most part, a carrier layer 14 that is made of a semiconductor material, preferably of silicon. Arranged on the carrier layer 14 is a buried oxide layer 16, for example, of silicon dioxide, which includes a thin semiconductor layer 18 of active semiconductor material, for example, of low p-doped single-crystal silicon. The thin semiconductor layer 18 initially has the same thickness d1 over the entire width of the SOI wafer 10 and is protected by a thin oxide layer 32. A hard mask 36, for example, of silicon nitride, defines an opening 38, in which a trench is produced in an etching step.

Figure 3:
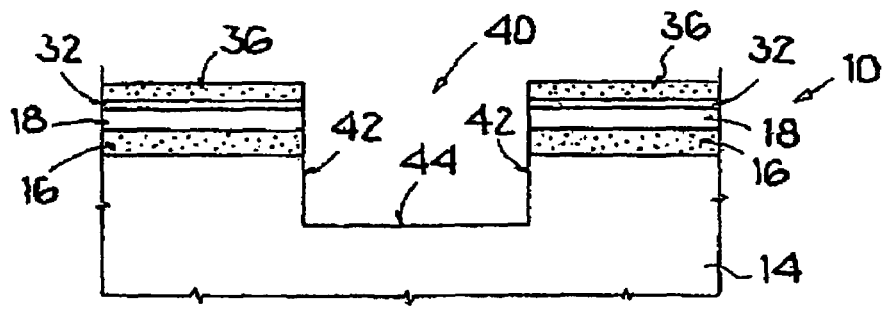
FIG. 3 shows the SOI wafer of FIG. 2 after a trench etching.

FIG. 3 shows a possible result of the etching step. A trench 40 is cut through the oxide layer, 32, the active semiconductor layer 18, and the oxide layer 16 and extends deep into the carrier layer 14.

Figure 4:
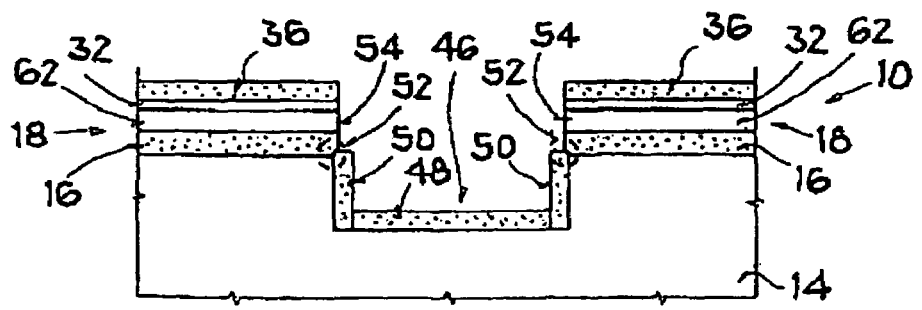
FIG. 4 shows the SOI wafer of FIG. 3 after oxidation and exposure of seed openings.

Next, walls 42 and bottom 44 of the trench are coated with a so-called liner oxide. A liner oxide is understood to be a thin oxide layer. A thicker oxide layer 46 with a bottom 48 and lateral spacers 50 are deposited on the liner oxide by a chemical vapor deposition step (CVD). The spacers 50 are then removed in the region of the interface of the trench 40 with the layers lying above the carrier layer 16, 18, 32, and 36, for example, by an etching process. In this case, the removal of the spacers 50 occurs only to the extent that the oxide layer 16 of the SOI wafer in regions 52 with the spacers 50 results in a continuous dielectric insulation of the carrier layer 14 from the regions lying thereabove and in the trench 40. The result of this sequence of steps is shown in FIG. 4.

Seed areas 54 in form of crystal planes of the single-crystal semiconductor layer 18 are produced by the removal of the spacers 50 in the interface between the active semiconductor layer 18 and the trench 40.

Figure 5:
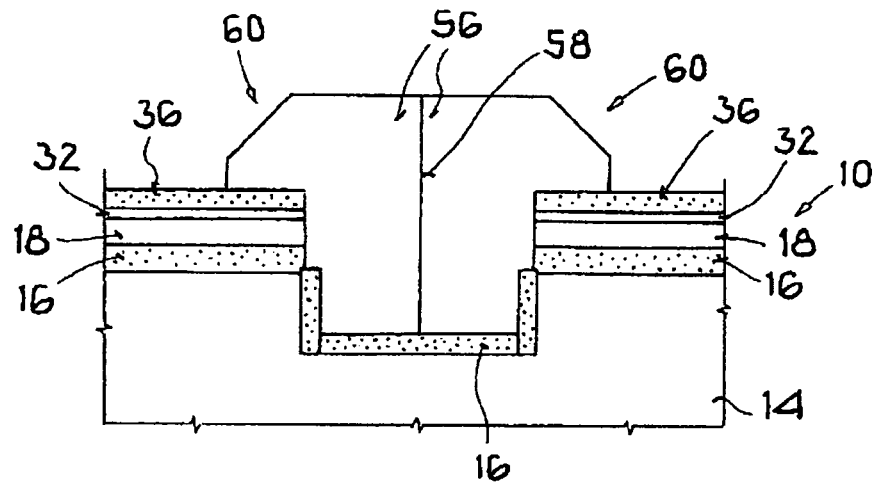
FIG. 5 shows the SOI wafer of FIG. 4 after an epitaxial step.

Starting from these seed areas or seed openings, filling of the trench 40 with active semiconductor material then occurs by an ELO process step. The result of this process step is shown in FIG. 5. The epitaxial growth is maintained until semiconductor material 56 growing out of the seed openings 54 fills the entire trench. A resulting growth groove 58 is particularly nonproblematic in a symmetric structure, as is shown in the figures. During the epitaxy, a doping can occur, which is uniform or has a lateral doping material concentration profile. Epitaxial mushrooms 60 forming in the epitaxy step are then removed, for example, by chemical/mechanical polishing (CMP).

Figure 6:
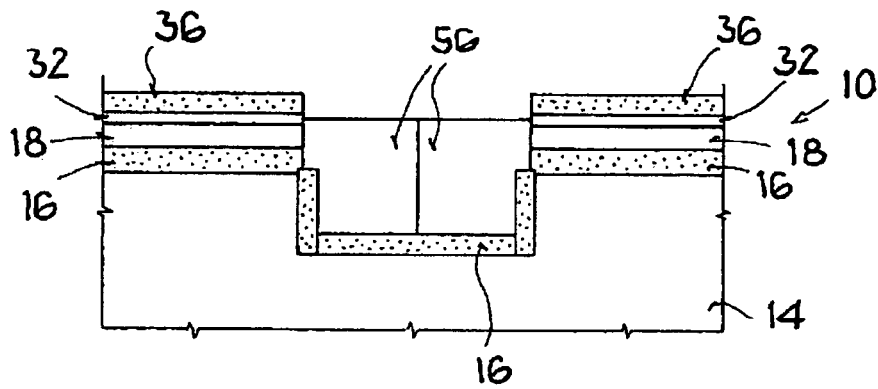
FIG. 6 shows the SOI wafer of FIG. 5 after a chemical/mechanical planing.

The result of this type of CMP step is shown in FIG. 6. FIG. 6 depicts the starting product for a realization of a DMOS transistor 12 in the SOI wafer 10. This starting product is characterized by an active semiconductor layer with regions 56, 62 having different thicknesses d2, d1. The regions 62 are subregions of the semiconductor layer 18 and are shown in FIG. 4.

Figure 7:
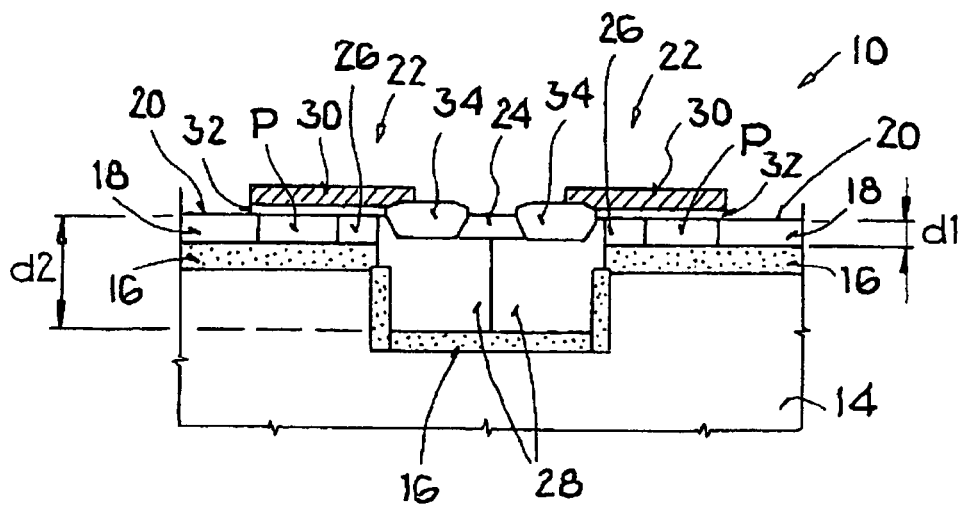
FIG. 7 illustrates a DMOS structure, that can be produced from the SOI wafer of FIG. 6.

A MOS transistor structure, as shown in FIG. 7, with a source region 20, a gate region 22, a drain region 24, and a drift region 26, 28 in the SOI wafer 10 can be produced by further process steps, whereby a portion 26 of the drift region 26, 28 in the originally thin active semiconductor layer 18 and the other portion 28 of the drift region 26, 28 lies in the trench 40 filled with active semiconductor material 56. As already mentioned, the source regions 20 and the drain region 24 in a realization of the MOS transistor as an NMOS transistor has highly doped, n-conducting zones in the low-doped p-conducting starting material of the active semiconductor layer 18. The letter P stands for the low p-doping of the starting material. The drift subregions 26 with the thickness d1, and 28 with the thickness d2 are electrically connected and otherwise dielectrically insulated. Despite the different single-crystal silicon layer thicknesses d1 and d2, the surface of the DMOS transistor is largely planar.

The source region 20, the drift regions 26, 28, and the drain region 24 are defined in the active semiconductor layer 18 by the laterally different doping material concentrations. As a result, a planar SOI wafer for a BCDMOS circuit is provided, whose active semiconductor layer 18, at least in a portion 28 of the drift region 26, 28, is thicker than in the source region 20, whereby the active semiconductor layer is continuously insulated dielectrically from the underlying carrier layer 14 by a continuous oxide layer 16. In BCDMOS structures with vertical "silicon-on-insulator" insulation (SOI), in such SOI wafers the active silicon thickness in the low-voltage CMOS portion can be very thin, so that source and drain lie on the buried oxide. In the DMOS drift region exposed to higher voltages, in contrast, a thicker active silicon layer is present, which increases the dielectric strength.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing a MOS transistor structure having a source region, a gate-region, a drain region, and a drift region in an SOI wafer, the SOI wafer having a carrier layer, which carries an insulating intermediate layer, the insulating intermediate layer carrying an active semiconductor layer, in which laterally different doping material concentrations define the source region, the drift region, and the drain-region, the active semiconductor layer at least in a portion of the drift region is thicker than in the source region, the method steps comprising:
producing a trench in an SOI wafer, which serves as a starting material with an active layer having a first thickness, the trench cutting through an initially planar insulating intermediate layer, the insulating intermediate layer being applied to walls and a bottom of the trench;
removing the insulating intermediate layer at least in a region from the walls, which cut through the active layer; and
filling the trench with an active semiconductor layer, which is thicker than the active semiconductor layer in the source region, to form the portion of the drift region.

2. The method according to claim 1, wherein the filling of the trench occurs by a selective epitaxial lateral overgrowth.

3. The method according to claim 2, wherein portions of the walls of the trench, which cut through the active layer, function as seed openings for the selective epitaxial overgrowth.

4. The method according to claim 2, wherein the entire trench is filled by the epitaxial growth and that epitaxial mushrooms formed during the growth are removed by chemical/mechanical polishing such that a largely planar surface of the MOS transistor structure results.

5. The method according to claim 2, wherein doping is changed during the selective epitaxy.

6. A method for producing a MOS transistor structure comprising:
providing an SOI wafer comprising a carrier layer, an insulating intermediate layer on the carrier layer and an active semiconductor layer on the insulating intermediate layer;
forming a trench in the SOI wafer extending through the active semiconductor layer and the intermediate insulating layer and into the carrier layer, the trench including at least one sidewall and a bottom;
applying an insulator material to at least a portion of the at least one sidewall and bottom of the trench;
filling the trench with an active semiconductor material such that the thickness of the active semiconductor material in the trench is greater than the thickness of the active semiconductor layer; and
forming a source region a gate region, a drain region and a drift region in the active semiconductor layer, the active semiconductor material in the trench forming a part of the drift region.

7. The method of claim 6 including removing the insulator material from a portion of the trench at least one sidewall that extends through the active semiconductor layer.

8. The method of claim 6 wherein filling the trench comprises filling the trench by selective epitaxial lateral overgrowth.

9. The method of claim 8, including using portions of the walls of the trench in the active semiconductor layer as seed openings for the selective epitaxial lateral overgrowth.

10. The method of claim 8 wherein filling the trench comprises filling the trench until an epitaxial mushroom is formed and removing the epitaxial mushroom by chemical/mechanical polishing to produce a generally planar surface over the trench.

11. The method of claim 8, including varying a doping level during the selective epitaxial lateral overgrowth.

12. The method of claim 6, wherein forming the drift region in the active semiconductor layer comprises forming the drift region in the active semiconductor layer and in the active semiconductor material.

13. The method of claim 6 wherein the insulating layer is formed of the insulator material.

14. The method of claim 6 wherein the active semiconductor layer is formed of the semiconductor material.

* * * * *